United States Patent
Hettler et al.

(10) Patent No.: US 12,431,691 B2
(45) Date of Patent: Sep. 30, 2025

(54) MULTILASER ARRANGEMENT AND HOUSING CAP FOR A MULTILASER ARRANGEMENT

(71) Applicant: Schott AG, Mainz (DE)

(72) Inventors: Robert Hettler, Kumhausen (DE); Christoph Kiesl, Landshut (DE); Josef Gabler, Altdorf (DE); Rainer Graf, Kumhausen (DE)

(73) Assignee: Schott AG, Mainz (DE)

( * ) Notice: Subject to any disclaimer, the term of this patent is extended or adjusted under 35 U.S.C. 154(b) by 218 days.

(21) Appl. No.: 17/969,940

(22) Filed: Oct. 20, 2022

(65) Prior Publication Data
US 2023/0045559 A1    Feb. 9, 2023

Related U.S. Application Data

(63) Continuation of application No. PCT/EP2021/060213, filed on Apr. 20, 2021.

(30) Foreign Application Priority Data

Apr. 20, 2020   (DE) .................... 10 2020 110 658.0

(51) Int. Cl.
*H01S 5/02257*    (2021.01)
*H01S 5/00*    (2006.01)
(Continued)

(52) U.S. Cl.
CPC .......... *H01S 5/4093* (2013.01); *H01S 5/0014* (2013.01); *H01S 5/02218* (2021.01);
(Continued)

(58) Field of Classification Search
CPC .. H01S 5/02315; H01S 5/4093; H01S 5/0014; H01S 5/02218; H01S 5/02251;
(Continued)

(56) References Cited

U.S. PATENT DOCUMENTS

| 5,436,920 A | 7/1995 | Minemoto et al. |
| 9,488,839 B2 | 11/2016 | Ikegami |

(Continued)

FOREIGN PATENT DOCUMENTS

| DE | 10 2011 081 417 A1 | 9/2012 |
| DE | 10 2018 106 685 A1 | 9/2019 |

(Continued)

OTHER PUBLICATIONS

U.S. Office Action dated May 4, 2023 for U.S. Appl. No. 17/235,582 (21 pages).

(Continued)

*Primary Examiner* — Xinning(Tom) Niu
(74) *Attorney, Agent, or Firm* — TAYLOR & EDELSTEIN, PC

(57) ABSTRACT

A multilaser arrangement includes: a housing including a base plate, a housing cap fastened on the base plate, and a transparent element, the base plate including a bottom face, the housing cap including an opening with the transparent element assigned to the opening for the passage of electromagnetic radiation; lasers, each being arranged inside the housing at a distance from the bottom face of the base plate, the housing cap including an upper wall and a side wall, which includes a lower edge and a surface, is formed integrally with the upper wall, and ends with the lower edge fastened on the base plate, the side wall having a first thickness and a second thickness, the first thickness being measured in a direction perpendicular to the surface, the second thickness being measured at the lower edge and being less than or equal to the first thickness.

23 Claims, 7 Drawing Sheets

(51) Int. Cl.
*H01S 5/02218* (2021.01)
*H01S 5/02251* (2021.01)
*H01S 5/02253* (2021.01)
*H01S 5/02315* (2021.01)
*H01S 5/40* (2006.01)
*G02B 27/01* (2006.01)
*G03B 21/20* (2006.01)

(52) U.S. Cl.
CPC ...... *H01S 5/02251* (2021.01); *H01S 5/02253* (2021.01); *H01S 5/02257* (2021.01); *H01S 5/02315* (2021.01); *H01S 5/4031* (2013.01); *G02B 27/0172* (2013.01); *G03B 21/2033* (2013.01)

(58) Field of Classification Search
CPC ............ H01S 5/02253; H01S 5/02257; H01S 5/4031; H01S 5/02208; G03B 21/20; G03B 21/2033; G02B 27/0172; G02B 27/017; G02B 2027/0178; A42B 3/042; A42B 3/30
USPC ........................................................ 372/39
See application file for complete search history.

(56) References Cited

U.S. PATENT DOCUMENTS

| | | | |
|---|---|---|---|
| 9,509,116 B2 | 11/2016 | Breidenassel et al. | |
| 10,283,930 B2* | 5/2019 | Reinert | H01S 5/02345 |
| 10,727,144 B2 | 7/2020 | Murayama et al. | |
| 11,784,459 B2 | 10/2023 | Yamamoto et al. | |
| 2008/0234560 A1 | 9/2008 | Nomoto et al. | |
| 2009/0103574 A1 | 4/2009 | Park | |
| 2011/0063871 A1 | 3/2011 | Tanaka et al. | |
| 2012/0033700 A1 | 2/2012 | Soejima et al. | |
| 2013/0044042 A1 | 2/2013 | Olsson et al. | |
| 2014/0240952 A1 | 8/2014 | Nakanishi et al. | |
| 2016/0285232 A1 | 9/2016 | Reinert et al. | |
| 2017/0141531 A1 | 5/2017 | Kyono et al. | |
| 2018/0010763 A1 | 1/2018 | Kyono et al. | |
| 2018/0183214 A1* | 6/2018 | Dawson | H01S 5/4012 |
| 2019/0097381 A1* | 3/2019 | Miyata | F21K 9/68 |
| 2019/0097722 A1 | 3/2019 | McLaurin et al. | |
| 2019/0121138 A1* | 4/2019 | Dykaar | G02B 27/30 |
| 2019/0121141 A1 | 4/2019 | Dykaar | |
| 2019/0229499 A1* | 7/2019 | Dawson | H01S 5/02255 |
| 2019/0293882 A1* | 9/2019 | Hettler | G02B 6/4237 |
| 2020/0194974 A1 | 6/2020 | Kozuru et al. | |

FOREIGN PATENT DOCUMENTS

| | | |
|---|---|---|
| DE | 10 2020 110 658 A1 | 10/2021 |
| DE | 20 2021 102 072 U1 | 6/2022 |
| EP | 1 285 303 B1 | 12/2004 |
| JP | 2009-99633 A | 5/2009 |
| JP | 2016-134173 A | 7/2016 |
| JP | 2018-6714 A | 1/2018 |
| WO | 2019/067042 A1 | 4/2019 |
| WO | 2020/004100 A1 | 1/2020 |

OTHER PUBLICATIONS

Notification of the Transmission of the International Search Report and Written Opinion of the International Search Authority or Declaration dated Jul. 1, 2021 for International Application No. PCT/EP2021/060213 (16 pages).

* cited by examiner d1 > d2

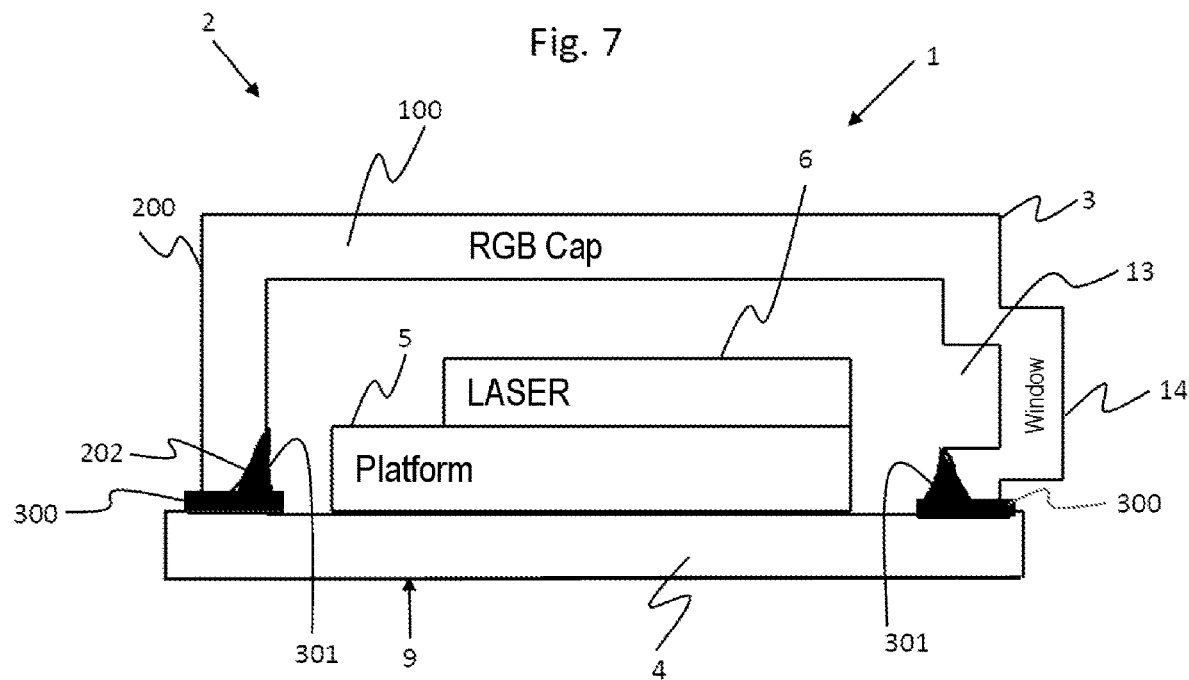
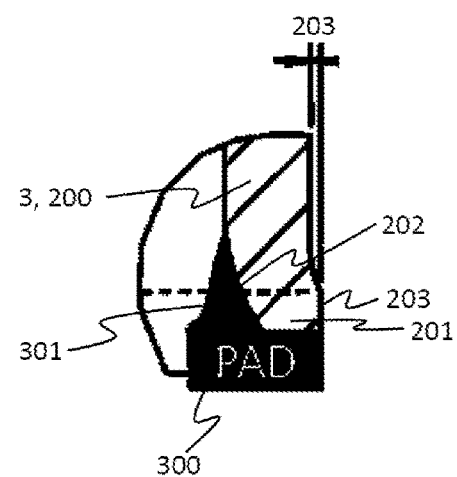

MULTILASER ARRANGEMENT AND HOUSING CAP FOR A MULTILASER ARRANGEMENT

CROSS REFERENCE TO RELATED APPLICATIONS

This is a continuation of PCT application no. PCT/EP2021/060213, entitled "MULTI-LASER ASSEMBLY AND HOUSING CAP FOR A MULTI-LASER ASSEMBLY", filed Apr. 20, 2021, which is incorporated herein by reference. PCT application no. PCT/EP2021/060213 claims priority to German patent application no. 10 2020 110 658.0, filed Apr. 20, 2020, which is incorporated herein by reference.

BACKGROUND OF THE INVENTION

1. Field of the Invention

The present invention relates to a multilaser arrangement, in particular an RGB laser module, as well as to a housing cap for such a multilaser arrangement.

2. Description of the Related Art

Multilaser arrangements are employed particularly in products for reproducing augmented reality (AR) or virtual reality (VR), for example in AR glasses or VR glasses. A multilaser arrangement is a component having a plurality of lasers which can project an image onto a user's retina. Three edge-emitting lasers (EELs) are often used in this case, one of the lasers emitting in the red wavelength range, one emitting in the green wavelength range and one emitting in the blue wavelength range.

The three lasers are enclosed with a view to reliable longevity, advantageously in a hermetically sealed housing, in particular for the exclusion of moisture. Above all, blue laser diodes typically require such a housing in order to achieve a desired longevity.

User requirements of AR or VR products, and in particular AR or VR glasses, are an inconspicuous appearance which cannot or can scarcely be distinguished from that of conventional products or glasses, the greatest possible wearing comfort, and a high-quality image. Miniaturization, weight reduction and optimization of multilaser arrangements are therefore increasingly desired.

What is needed in the art is a multilaser arrangement, in particular an RGB laser module, a housing cap for such a multilaser arrangement, and a method for producing a housing cap, which allows miniaturization, weight reduction and/or optimization of the image.

SUMMARY OF THE INVENTION

The present invention provides a multilaser arrangement, in particular an RGB laser module, which includes a housing and a multiplicity of lasers, which are arranged inside the housing.

The housing includes a base plate and a housing cap fastened on the base plate, the housing cap including at least one opening with a transparent element assigned to this opening for the passage of electromagnetic radiation.

The lasers are in particular a first laser emitting in the red spectral range, a second laser emitting in the green spectral range and a third laser emitting in the blue spectral range.

The lasers are respectively arranged inside the housing, at a distance from the bottom face of the base plate, and optionally on a platform. The lasers are optionally configured as edge-emitting lasers (EELs).

The housing cap of the housing includes an upper wall and a side wall, which is formed integrally with the upper wall and ends with a lower edge fastened on the base plate.

Furthermore, the side wall has a first thickness, measured in a direction perpendicular to its surface, and a second thickness measured at the lower edge, particularly in the same direction, which is less than or equal to the first thickness.

In this way, advantageously, a smaller design may be made possible and/or a lateral projection at the lower edge may be obviated or may be minimized. In particular, the width of a metallization (pad width) on a counter-piece (in particular a base plate, for example a ceramic substrate) may be reduced, which contributes to miniaturization of the assembly, or increases the installation space inside the housing.

In one optional embodiment, the side wall has an outwardly curved surface at the lower edge on the inner side of the housing cap, in particular such that the thickness of the side wall decreases gradually toward the lowermost position of the side wall.

The side wall may be configured without an overhang at the lower edge on the outer side, or it may have an overhang which is optionally less than the first thickness, optionally less than one half of the first thickness, optionally less than one fourth of the first thickness.

Optionally, the lower edge of the side wall is fastened on the base plate in such a way that a connecting material (for example a solder material) is introduced between the lower edge of the side wall and the base plate, in particular over a region which is shorter along the direction of the first thickness or the second thickness of the side wall than the first thickness or the second thickness of the side wall.

The lower edge of the side wall may be fastened on the base plate in such a way that a connecting material (for example a solder material) is introduced between the outwardly curved surface on the inner side of the housing cap and the base plate, in particular such that the connecting material protrudes higher from the base plate on the inner side of the housing cap than between the lower edge of the side wall and the base plate.

As an alternative or in addition, the lower edge of the side wall may be fastened on the base plate in such a way that a connecting material is introduced between the outer side of the side wall and the base plate, for example between the overhang and the base plate, in particular such that the connecting material protrudes higher from the base plate on the outer side of the housing cap than between the lower edge of the side wall and the base plate.

The side wall may be configured in such a way that it tapers at the lower edge, in particular tapers along a direction extending from the upper edge to the lower edge.

Optionally, the second thickness of the side wall, measured at the lower edge, may be at least 5 percent less than the first thickness of the side wall, optionally at least 10 percent less, optionally at least 15 percent less, optionally at least 20 percent less, or at least 25 percent less, or at least 30 percent less than the first thickness of the side wall.

The second thickness, measured at the lower edge, can correspond to a thickness of the side wall at the lowermost position of the side wall.

The first thickness of the side wall, measured in a direction perpendicular to its surface, may correspond to a thickness of the side wall at a position which is adjacent to the upper wall, and/or to a thickness of the side wall at a position which is located between the upper wall and the lower edge, particularly in a range of from 25 to 75 percent between the upper wall and the lower edge, and/or to an average thickness of the side wall.

The second thickness of the side wall, measured at the lower edge, is in particular measured in the same direction as the first thickness of the side wall or in a direction which deviates therefrom by less than 45 degrees, less than 25 degrees, or less than 10 degrees.

The second thickness of the side wall, measured at the lower edge, is in particular measured in a direction which extends substantially parallel to the surface of the upper wall and/or the bottom face of the base plate or in a direction which deviates therefrom by less than 45 degrees, less than 25 degrees, or less than 10 degrees.

In one optional embodiment, the housing cap is configured in the shape of a hat, such that the side wall formed integrally with the upper wall is configured as laterally circumferential walling having in particular four planar side walls.

The at least one opening of the housing cap is optionally arranged in the or a side wall.

Optionally, a multiplicity of openings are provided in the or a side wall, optionally corresponding to the number of lasers, three openings optionally being provided.

The at least one opening, in particular each of the multiplicity of openings, optionally has a greater extent along a direction from the upper wall to the lower edge than along a direction extending perpendicularly thereto in the side wall.

The at least one opening, in particular each of the multiplicity of openings, may in particular have an elliptical shape with a major axis along a direction from the upper wall to the lower edge.

The housing cap may include the transparent element assigned to the at least one opening. The transparent element may for instance be applied with a connecting material on the side wall including the at least one opening, in order to hermetically close the at least one opening. Optionally, the transparent element may hermetically close each of a multiplicity of openings as an integral component.

In one optional embodiment, the transparent element is fastened on the outer side of the housing cap, in particular on the outer side of the or a side wall, in particular the side wall including the at least one opening, in particular with a connecting material (for example a solder material, for example glass solder).

The transparent element is optionally fastened obliquely with respect to the surface of the side wall, in particular such that the transparent element has a greater distance from the side wall toward the lower edge of the side wall than toward the upper wall.

In this way, a return reflection of the emitted light at the transparent element back into one or more lasers may be suppressed very effectively.

Optionally, the transparent element may be fastened at the lower edge on an overhang formed on the outer side of the side wall, and in particular may therefore be oblique with respect to the surface of the side wall.

In one optional embodiment, the upper wall of the housing cap has a thickness, measured in a direction perpendicular to its surface, which is less than the first thickness of the side wall, in particular at least 10 percent less, or at least 20 percent less or at least 30 percent less than the first thickness of the side wall.

In this way, advantageously, a weight reduction may be achieved and/or a lightweight design may be made possible.

The upper wall of the housing cap may also have a thickness, measured in a direction perpendicular to its surface, which is less than the second thickness of the side wall, in particular at least 10 percent less, or at least 20 percent less or at least 30 percent less than the second thickness of the side wall.

The upper wall and the side wall formed integrally with the upper wall may include metal or consist of metal.

The base plate may include ceramic or consist of ceramic or include metal or consist of metal.

The transparent element may include glass or sapphire or consist of glass or sapphire and/or may have an optical treatment, optionally an antireflection coating.

The invention furthermore relates to a housing cap for a multilaser arrangement, in particular a multilaser arrangement as described above. The housing cap according to the invention may, in particular, include one or more of the features described above in connection with the multilaser arrangement.

Furthermore, the invention relates to a method for producing a housing cap, in particular a housing cap as described above, in particular as described above in connection with the multilaser arrangement.

The method according to the invention includes providing a flat starting material, in particular including or consisting of metal, optionally introducing one or more openings, in particular circular openings, into the flat starting material, deep-drawing the flat starting material in such a way that a housing cap having an upper wall and a side wall formed integrally with the upper wall are obtained, in particular such that the one or more openings are arranged as elliptical openings in a side wall and/or the upper wall has a smaller thickness than the side wall, trimming the side wall at the lower edge, in such a way that the side wall has a first thickness, measured in a direction perpendicular to its surface, and a second thickness measured at the lower edge, particularly in the same direction, which is less than or equal to the first thickness, and optionally fastening a transparent element, optionally with a connecting material, on the side wall including the at least one opening, in order to hermetically close the opening, particularly such that the transparent element is oblique with respect to the surface of the side wall.

Lastly, the invention relates to an apparatus which includes a multilaser arrangement, in particular an RGB laser module, as described above. In particular, the invention relates to the following apparatuses.

The invention relates in particular to a head-mounted display, in particular AR glasses or glasses, including a multilaser arrangement and/or a housing cap according to the description above.

The invention furthermore relates to a head-up display including a multilaser arrangement and/or a housing cap according to the description above.

The invention also relates to a motorcycle helmet including a head-up display according to the description above.

The invention additionally relates to a projector including a multilaser arrangement and/or a housing cap according to the description above.

Lastly, the invention also relates to a projector of a mobile device, including a multilaser arrangement and/or a housing cap according to the description above.

The German patent application giving rise to a right of priority, with the application number 10 2020 110 658.0, and the German utility model with the application number 20

2021 102 072.5 are incorporated here by reference and therefore also belong fully to the disclosure content of this application as if they were contained in this document. The features of the documents hereby incorporated correspond in particular to the features in the scope of this document, when there is a matching reference.

In particular, the multilaser arrangement may therefore include:
a housing, having
  a housing cap,
    in which at least one opening
    having a transparent element assigned thereto
    for the passage of electromagnetic radiation is formed,
  a base plate,
wherein
  a first laser, in particular emitting in the red spectral range of the visible spectrum,
  a second laser, in particular emitting in the green spectral range of the visible spectrum, and
  optionally a third laser, in particular emitting in the blue spectral range of the visible spectrum,
  are arranged inside the housing, wherein
  an electrical supply lead is guided through the housing to a respective laser, and
  during operation of a laser, a main part of its emitted light passes through the transparent element,
wherein each laser respectively
  (i) is optionally arranged on a platform,
  (ii) at a distance from the bottom face of the base plate,
  (iii) and the lasers are respectively aligned with respect to one another, wherein the main direction of the laser emission is substantially parallel to the base plate of the housing.

The use of a platform allows a very defined arrangement of the lasers inside the housing and optimization of the housing geometry, in particular reduction of its size while simultaneously providing the main part of the laser emissions as usable light. The main part of the laser light is intended to mean a proportion of more than 80%, optionally more than 85% and optionally more than 90% of the light emitted by a respective laser through its end face emitting in the direction of the transparent element.

Furthermore, the platform may include a material having a heat capacity defined by its size and a specific thermal conductivity which allow the respective lasers to be purposely cooled during their operation, that is to say to purposely draw heat from them while dissipating this heat to the exterior of the housing.

An advantage of this multilaser arrangement is also the separate electronic drivability of the respective lasers, in particular while also taking the base plate into account, in which case, depending on the color or intensity represented, that is to say the luminance or chrominance of an image signal which may be represented, not all lasers emit simultaneously and they may even be entirely emission-free during off phases, or dark phases, there being only a small optical interaction between the respective lasers inside the housing, with which relatively high emissions, that is to say full electronic driving of one of the lasers, do not lead to an optical interaction with another respective laser, in particular when the latter is for example emitting only with a much lower intensity.

An advantage over, for example, semiconductor arrangements emitting perpendicularly to the base plate is also the better integratability of the RGB laser module, particularly in applications which make only a small space available, since the base plate may then be configured as a supporting assembly and, for example, receive further optical assemblies, in particular while being aligned with the light emitted by the lasers.

In general, in the scope of the present disclosure, it is assumed that the blue spectral range is the range of wavelengths of from 450 nm to 490 nm, the green spectral range is the range of wavelengths of from more than 490 nm to 560 nm, and the red spectral range is the range of wavelengths of from 630 nm to 700 nm, so that a color space advantageous for the representation of visual signals may be provided with the multilaser arrangement disclosed here.

As an alternative, more than one of the lasers or all lasers may emit light in the same spectral range, which may for example be advantageous when the multilaser arrangement is used for illumination purposes.

In the scope of the present disclosure, the main direction of the laser emission refers to the optical axis of the laser light emitted by the respective laser, or at least the propagation direction of the maximum intensity in relation to the maximum of a lateral intensity distribution of the emitted laser light and therefore the direction of the axial translation of the lateral intensity maximum.

In the scope of the present disclosure, for the sake of brevity the term main emission direction will also be used synonymously for the main direction of the laser emission.

The statement that the main direction of the laser emission is substantially parallel to the base plate of the housing means that this main direction of the laser emission rises by no more than 5° from the plane which is defined by the lower surface of the base plate or bottom plate 4, or is inclined by no more than 5° below the latter.

A particularly advantageous arrangement is obtained when the housing cap includes metal or consists of metal and the base plate includes metal or consists of metal and the housing cap is connected to the base plate by welding.

In this case, the term "includes metal" is intended to mean that, for example, a metallic body may be partially or fully covered with nonmetallic coatings, for example oxide layers or lacquers, in particular highly absorbent matt lacquers.

Connection of the housing cap to the base plate by welding or fusion offers significant advantages for the long-term operating durability of the multilaser arrangement, since a fluidically and hermetically sealed connection may then be provided between the housing cap and the base plate, which corresponds for example to the standard MIL-STD 883, Method 1014.

Often, when soldering such housings, for example a housing cap, to an optionally metallically coated ceramic substrate as a base plate, fluxes such as formic acid are used in an atmosphere containing nitrogen or hydrogen, residues of which subsequently remain in the housing, and even only as traces these can interact with and damage the semiconductor material of semiconductor lasers emitting in the blue spectral range.

This is not the case in the embodiment described here since therein, for example, the transparent element may then initially be fastened on the housing cap by a soldering process and the process of welding to the base plate may be carried out subsequently, in particular after cleaning the housing cap. In this way, it is possible to ensure that there is an $H_2O$ content of less than 5000 ppm in the atmosphere inside the housing, and this just still permissible partial pressure of water is not exceeded over the entire lifetime of the component because of the gas-tight configuration of the housing, corresponding to the standard MIL883, Method 1018.

If the platform is configured integrally with the base plate, this offers advantages in terms of manufacturing technology since a correspondingly shaped base plate may then be provided economically by material-removing surface processing or an embossing process.

If, however, the base plate includes or consists of a metal, for example cold-rolled CRS1010 steel, and the platform consists of or includes a different material than the base plate, in particular oxygen-free high thermal conductivity copper, OFHC, and the platform is optionally pressed, soldered or welded with the base plate, a platform having a defined advantageous specific thermal conductivity may thereby be provided, the heat capacity of which is given by its design dimensions, its specific heat capacity and its material selection. This allows efficient temperature management by controlled cooling of the respective lasers.

The material specifications above are in this case given merely by way of example, and other metals may also be used instead, for example aluminum, steels or stainless steels, as well as austenitic and ferritic stainless steels, although optionally only insofar as they remain rust-free when carrying out the invention. Furthermore, titanium as well as Monel alloy with a high proportion of copper or sealing alloys including NiFe alloys or NiFeCo alloys may also be used in principle.

In other advantageous embodiments, an FAC lens (fast-axis collimating lens) is arranged on the platform, optionally at a distance from the end face of the lasers, so as to obtain maximally efficient beam-shaping with low intensity losses by masking of a divergent ray bundle of the emitted laser light.

Particularly optionally, the transparent element may include glass or consist of glass. In this case, the glass of the transparent element may for example include quartz glass or borosilicate glass. Furthermore, the transparent element may also consist of sapphire or include sapphire, particularly in each case as a crystal material.

In general, however, the transparent element has a transmission in a spectral range with a wavelength of from 250 to 2000 nm which is more than 80%, particularly optionally more than 90%, when it is measured in the direction of the radiation emitted by the lasers.

In the context of the present disclosure, the terms light emitted by the lasers and radiation emitted by the lasers are to be understood in the same sense and are used synonymously.

In another configuration, the transparent element may be configured as an FAC lens (fast-axis collimating lens) or may also include an FAC lens (fast-axis collimating lens), in particular applied thereon.

As an alternative, the transparent element may be configured as a fiber plate or include a fiber plate.

In optional embodiments, the transparent element is held on the housing cap by way of glass solder or is held by way of glass solder on a frame arranged on the housing cap.

In other optional embodiments, which are intended to have smaller dimensions than the aforementioned embodiments using glass solder for connecting the transparent element to the housing cap, the transparent element may be held on the housing cap by way of a metallic solder, optionally AuSn solder.

Another configuration includes a transparent element which is welded on the housing cap.

If at least that wall of the housing cap on which the transparent element is arranged is configured to be inclined relative to the base plate, the angle of inclination of the wall of the housing cap relative to the normal direction of the bottom face of the base plate lying in a range of from 35° to 60°, optionally from 40° to 50°, optionally from 43° to 48°, a return reflection of the emitted light at the transparent element back into one or more lasers may be suppressed very effectively. These designs may generally obviate an antireflection coating of the transparent element, without entailing disadvantages for the functionality of the multilaser arrangement due to reflected or scattered light.

The aforementioned angles of inclination a are optionally selected for the deliberate generation of a return reflection which is used to measure the laser power by way of monitor photodiodes, which are also referred to here as monitor diodes.

In order to suppress direct return reflection into the laser resonator of the respective lasers of the RGB laser module, even smaller angles of for example typically 7°-15° are however sufficient.

Very advantageously, a monitor diode may then also be arranged below the transparent element, and laser light reflected back by the transparent element may impinge on the monitor diode so that a sensing signal for the intensity of the light emitted by a respective laser assigned to the monitor diode may be obtained. In this way, it is possible to obtain a rapid and effective feedback signal which allows precise and controlled driving of the multilaser arrangement.

In this case, the term below is intended to be understood relative to the base plate and the housing cap. Extending perpendicularly from the base plate, that is to say in the normal direction, in the direction of the housing cap is to be understood as upwardly directed. In this direction, there may therefore be a body above, below or at the same height as another body in this direction. With reference to a Cartesian coordinate system which will be described below, upwardly directed also refers to its positive Z direction.

As an alternative or in addition, monitor diodes may be arranged behind the lasers, in particular on a carrier assigned thereto, each laser optionally being assigned at least one monitor diode of its own, in which case this carrier may have conductive coatings as electrical supply leads for the respective monitor diode.

In the context of the present disclosure, the light exit face of the lasers, which faces toward the transparent element, is defined as the front side and the propagation direction of the laser light passing through this light exit face is defined as emerging in the "forward direction" or emitted in the "forward direction". The expression arranged behind the lasers defines a position which is located before the further light exit face of the lasers, which lies on the side facing away from the transparent element.

Optionally, in this case the monitor diodes may be arranged on a carrier optionally including ceramic or consisting of ceramic, and the normal direction of that face of the carrier on which the monitor diodes are arranged may be configured to be oblique relative to the main emission direction of at least one of the lasers, the obliquity lying in an angle range relative to the main emission direction of from 3° to 15°, optionally from 5° to 10°, optionally from 6° to 8°. In this way, light emerging from the backside of the lasers is reflected very effectively by the monitor diodes in such a way that it no longer re-enters one of the lasers, and undesired optical interactions, for example mode couplings of resonator modes of the respective lasers, consequently do not occur.

In another optional embodiment, the normal direction of at least that wall of the housing cap on which the transparent element is arranged is configured to be oblique relative to the main emission direction of at least one of the lasers, the obliquity lying in an angle range relative to the main emission direction of from 3° to 15°, optionally from 5° to 10°, optionally from 6° to 8°. In this way, light emerging from the front side of the lasers is reflected very effectively by the surfaces of the transparent element in such a way that it no longer re-enters one of the lasers and undesired optical interactions, for example couplings of the resonator modes of the respective lasers, consequently do not occur.

In an alternative configuration, the housing cap can include a plurality of openings, a transparent element in each case respectively being assigned to one of these openings or a transparent element being assigned to all of these openings together.

In another advantageous configuration, the housing cap includes a plurality of openings, a transparent element which forms a beam-shaping optical element that is selected from the following group of optical elements respectively being arranged on one of the openings:

spherical planoconvex or concave-convex lenses,
spherical or hemispherical lenses,
aspherical planoconvex or concave-convex lenses.

In this way, the multilaser arrangement may be very compact and, because of its precise dimensions, may optionally even be integrated into external optical systems while being optically preadjusted, that is to say already adjusted in terms of the axial and lateral position of the optical elements. In this case, the base plate of the multilaser arrangement may optionally be inserted into a precisely arranged preshaped recess of the further optical system and be received while already being adjusted with respect to the further optical system by this positioning. By the contact of the base plate with the further optical system, heat may furthermore be dissipated in a defined way from the multilaser arrangement, and additional cooling of the lasers of the multilaser arrangement may be carried out by the further optical system.

If a light-guiding fiber is connected to the housing, in particular the housing cap, optionally by way of a fiber connector, in particular a releasably connectable fiber connector or by a permanently connectable fiber connector, further design freedom is offered since the multilaser arrangement may for example in this way be arranged at a distance from a further optical system, as will be explained in more detail below merely by way of example for the further optical system provided by AR glasses.

If a light-guiding fiber is assigned to each laser of the multilaser arrangement and the fibers assigned to the lasers are combined in a fiber bundle, in which they are arranged with their respective fiber cores optionally close to one another and a common fiber cladding enclosing the fiber cores is optionally formed, this may furthermore contribute to design compactness of a system consisting of a multilaser arrangement and a further optical system. If, for example, the optical fibers are in this case arranged next to one another in a plane in which the row direction of an assigned imaging instrument extends, for example in the case of an assigned further optical instrument having row-by-row image construction, a white color impression may already be imparted to the human eye by the superposition, taking place in the row direction, of the components of the light of the first laser emitting in the red spectral range of the visible spectrum and the second laser emitting in the green spectral range of the visible spectrum as well as the third laser emitting in the blue spectral range of the visible spectrum, if these respective color components are superimposed so rapidly in the respective row that a color change is no longer resolved by the human eye. In this way, a fiber splicing process possibly extended in length may be obviated, and the respective fibers of this embodiment may be configured to be very short.

In the scope of the present disclosure, the terms fiber, optical fiber and light-guiding fiber are respectively used for a fiber which is suitable for guiding the light of the blue-, green- and red-emitting lasers in the entire spectral range emitted by the lasers and for transmitting it with low losses from its entry end to its exit end. Such fibers are known to a person skilled in the present field and need no further explanation.

Advantageously, the multilaser arrangement may include glass-metal feedthroughs for supply leads to the lasers and/or to the monitor diodes.

If the monitor diodes respectively have color filters, in particular respectively configured as a bandpass filter for the emission wavelength of the respectively assigned laser, the light of the respective further lasers may be suppressed and a better signal/interference-signal ratio or a better signal/noise ratio of the sensing signals of the monitor diodes may be obtained.

If the base plate of the housing is configured as a reference potential and so as to carry current, the electronic interconnection of the multilaser arrangement may thereby be simplified, and a housing which is operationally reliable for a user may be provided.

In another advantageous configuration, the base plate may be configured as a carrier of optical assemblies, in particularly structurally projecting below the housing cap.

In order to suppress stray light, the inner side of the housing cap may be configured to be blackened, in particular matt-blackened, in which case it is possible to use a lacquer or a coating, for example black chrome plating or a zinc-nickel coating, including in particular as an electrolytic coating. In this way, in the spectral range of the light emitted by the lasers, 98% or more of the light impinging on this surface may be absorbed by a surface coated in this way.

Advantageously, the housing may have a protective instrument for the glass of the transparent element, this instrument being configured in particular as a section protruding beyond the transparent element in the lateral direction.

A multilaser arrangement which has an attractive design may be provided for many applications, in particular mobile applications, if for example the housing includes as housing dimensions a height, particularly in the X direction, of from 1.0 to 3.5 mm and/or a width, particularly in the Y direction, or from 4 to 10 mm and/or a length, particularly in the Z direction, of from 4 to 10 mm.

The directions mentioned above, in particular the respective X, Y and Z directions, will be explained further in the scope of the following detailed description, in particular with reference to the Cartesian coordinate system represented in FIG. 1.

These mobile applications may for example relate to AR glasses or glasses, which include such a multilaser arrangement, or a head-up display, for example for helmet visors, for example a protective helmet such as a motorcycle helmet or a helmet for police forces or security forces or for devices or instruments in avionics.

Projectors may also benefit from the multilaser arrangement disclosed here and its very small dimensions, particularly for the use thereof in mobile devices.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawing, wherein:

FIG. 7 shows a cross-sectional representation of a further multilaser arrangement according to the present invention;

FIG. 8 shows a cross-sectional representation of the lower edge of a side wall with connecting material;

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

In the following description of optional embodiments, references which are the same respectively denote assemblies or constituents which are the same or have the same effect. The same applies for the incorporated German patent application with the application number 10 2020 110 658.0 (which is incorporated by reference herein) and the incorporated German utility model with the application number 20 2021 102 072.5 (which is incorporated by reference herein).

Figure 1:
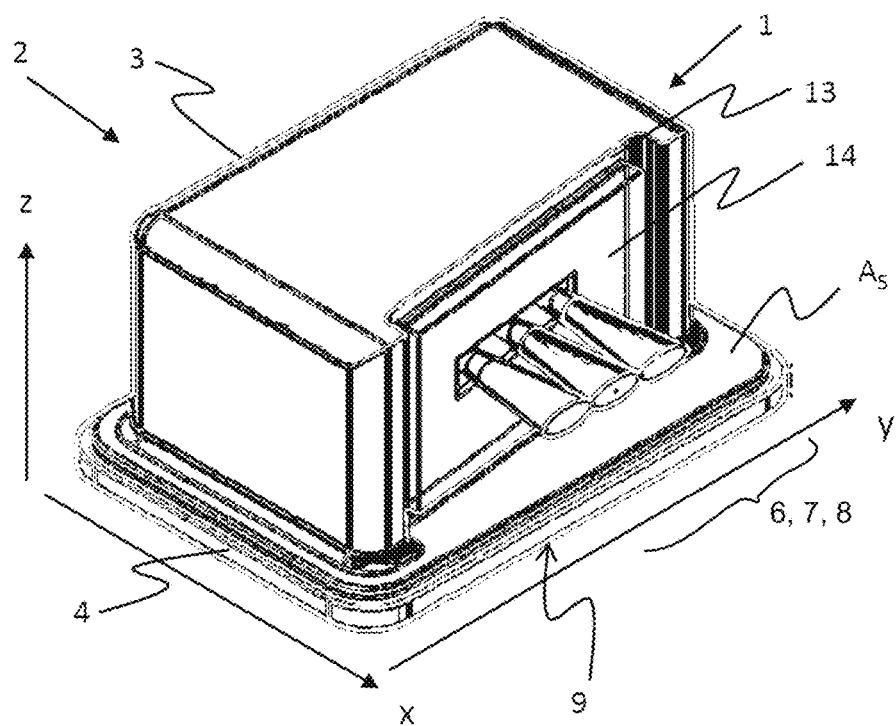
FIG. 1 shows a perspective representation of a multilaser arrangement shown for comparison.

FIG. 1 shows for comparison a multilaser arrangement 1 having a housing 2 including a housing cap 3, which is held fluidically and hermetically sealed on a base plate 4.

Between the housing cap 3 and the base plate 4, there is a weld seam S (not shown in FIG. 1) which extends substantially over the entire contact area between the housing cap 3 and the base plate 4 below a lateral projection $A_5$ of the housing cap 3 forming a welding flange.

In the context of the present disclosure, an object, for example the housing of the multilaser arrangement, is regarded as hermetically sealed or fluidically sealed if it has a leakage rate of less than $1 \times 10^{-3}$ mbar*l/sec at room temperature when filled with He at a pressure difference of 1 bar.

Optionally, however, a leakage rate of $1*10^{-8}$ mbar*l/s is achieved when filled with He at a pressure difference of 1 bar. Since the leaktightness value to be achieved may be dependent on the internal volume of the housing, however, the leaktightness achieved in the present case ensures that a partial pressure of water in the housing of the multilaser arrangement does not exceed the value 5000 ppm throughout the entire lifetime of the component.

A platform 5 (not shown in FIG. 1) is arranged on the base plate 4, or is formed by the base plate 4 itself.

In optional embodiments, a first laser 6 emitting in the red spectral range of the visible spectrum (not shown in FIG. 1), a second laser 7 emitting in the green spectral range of the visible spectrum (not shown in FIG. 1) and a third laser 8 emitting in the blue spectral range of the visible spectrum (not shown in FIG. 1) are arranged inside the housing 2.

Each of the aforementioned lasers 6, 7 and 8 is respectively arranged on the platform 5 and is applied thereon so that each of these lasers 6, 7 and 8 has a defined distance from the bottom face 9 of the base plate 4. The bottom face 9 of the base plate refers to its lower side.

Before the front-side light exit faces (not shown in FIG. 1) of the lasers 6, 7 and 8, an opening 13 in which a transparent element 14 is applied is formed in the housing cap 3.

In a optional embodiment, the transparent element 14 is held, for example by way of a glass solder, on the housing cap 3.

In alternative configuration, the transparent element 14 is held by way of a gold solder, for example by an AuSn solder, on the housing cap 3 itself.

Use of the gold solder allows direct application of the window 14 on the housing cap 3 with less stringent requirements for the design dimensions both of the transparent element 14 and of the housing cap 3.

Figure 2:
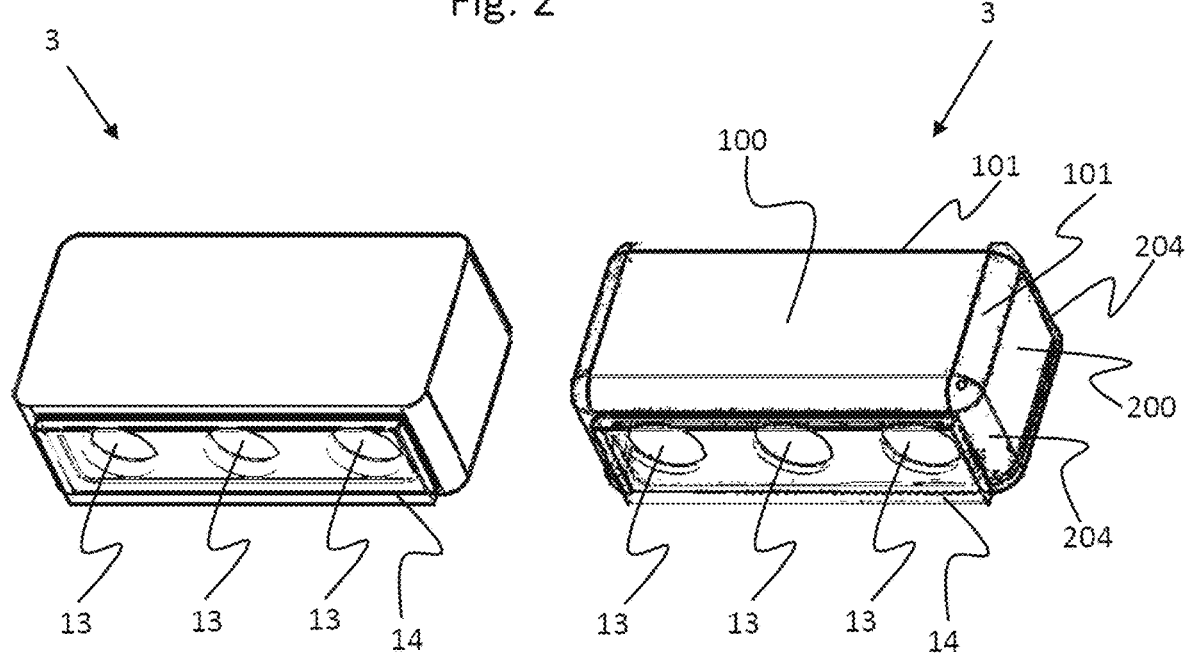
FIG. 2 shows two perspective representations of housing caps according to the present invention for a multilaser arrangement.

FIG. 2 shows two housing caps 3 according to the invention for a multilaser arrangement 1. The housing caps 3 respectively have three separate, in particular round openings 13, each of the openings being provided for the laser light of one of the three lasers 6, 7 and 8.

The housing caps 3 furthermore respectively include a transparent element 14 which is connected in a hermetically sealed fashion to that side wall of the housing cap 3 which includes the openings 13 by way of a connecting material, in particular by way of solder, for example glass solder and/or metal solder.

The housing caps 3 with an integrated optical window may, in particular, be used for the hermetic encapsulation of RGB lasers. This housing cap 3 may therefore also be referred to as an RGB cap.

The embodiment shown on the left in FIG. 2 is a housing cap 3 (RGB cap) which is producible or produced by way of a turning and milling technique. This may in particular be advantageous with a view to delivery time, cost and/or design flexibility.

The housing cap 3 accordingly has a milled metal housing in which concentric openings 13 (emitter openings) are introduced. The transparent element 14 forms an optical window and may consist of sapphire or glass. An antireflection coating may furthermore be provided for increased transmission. In this way, radiation losses can be minimized. The optical window is connected in a hermetically sealed fashion to the metal housing by way of a soldering process (solder consisting, for example, of glass solder or metal solder).

The embodiment shown on the right in FIG. 2 is a housing cap 3 (RGB cap) which is producible or produced by way of a deep-drawing process. This may be advantageous for economic reasons and furthermore offers further product advantages which will be described in more detail below.

The housing cap 3 accordingly has a deep-drawn metal housing in which concentric openings 13 (emitter openings) are introduced. The transparent element 14 forms an optical window and may again consist of sapphire or glass. Again, an antireflection coating may furthermore be provided for increased transmission, so that radiation losses can be minimized. The optical window is connected in a hermetically sealed fashion to the metal housing by way of a soldering process (solder consisting, for example, of glass solder or metal solder).

The housing cap 3 has, in particular, an upper wall 100 and a side wall 200, which is formed integrally with the upper wall 100 and in this example is configured extending around the z axis. The side wall 200 is in this example configured as walling extending around laterally with four planar side walls. Between the upper wall 100 and the side wall 200, there is a rounded edge 101. Optionally, there may also be rounded edges 204 between the planar side walls. A rounded edge 101 or 204 may be characterized by an outer radius on the outer side of the housing cap 3 and/or by an inner radius on the inner side of the housing cap 3. The inner radius may for example correspond to the thickness d1 or lie in the range of from half the thickness d1 to two times the thickness d1.

Figure 3:
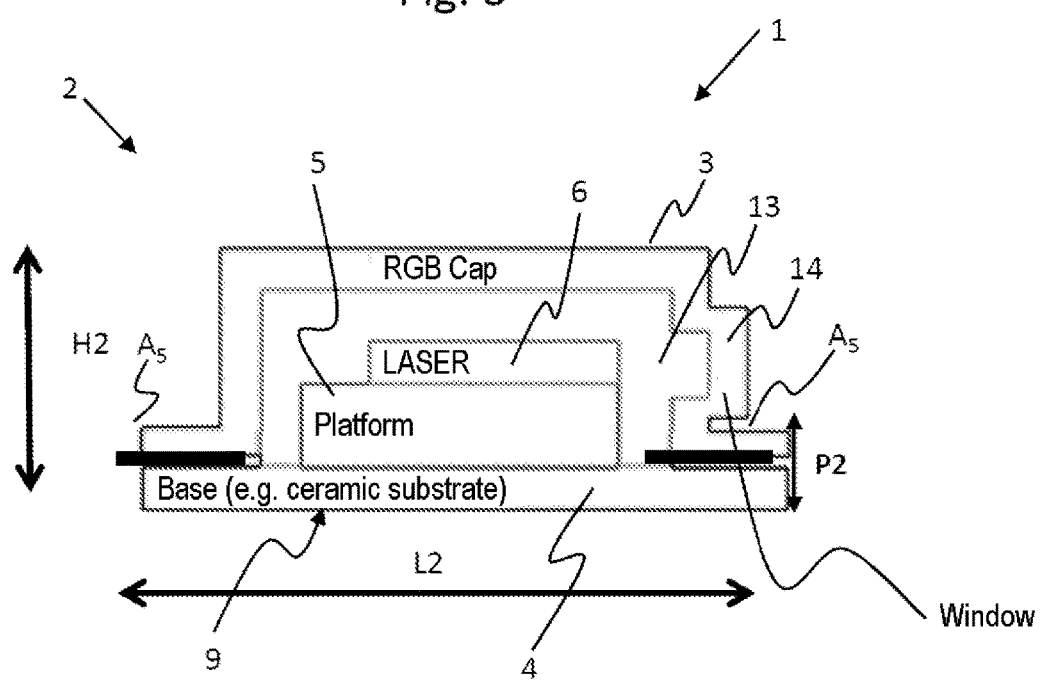
FIG. 3 shows a cross-sectional representation of a multilaser arrangement shown for comparison.

FIG. 3 shows for comparison a multilaser arrangement 1 having a housing 2 with a housing cap 3 which is hermetically fastened on a base plate 4, a platform on which a first laser 6 as well as a second and third laser 7 and 8 (not shown in FIG. 3) are arranged on the base plate 4.

The housing cap 3 shown has a lateral projection $A_5$, or a laterally protruding flange. This projection $A_5$, or the flange, may however limit the installation space and/or the lateral extent of the housing 2 as well as the position height of the transparent element 14 or of the emitter openings 13.

Figure 4:
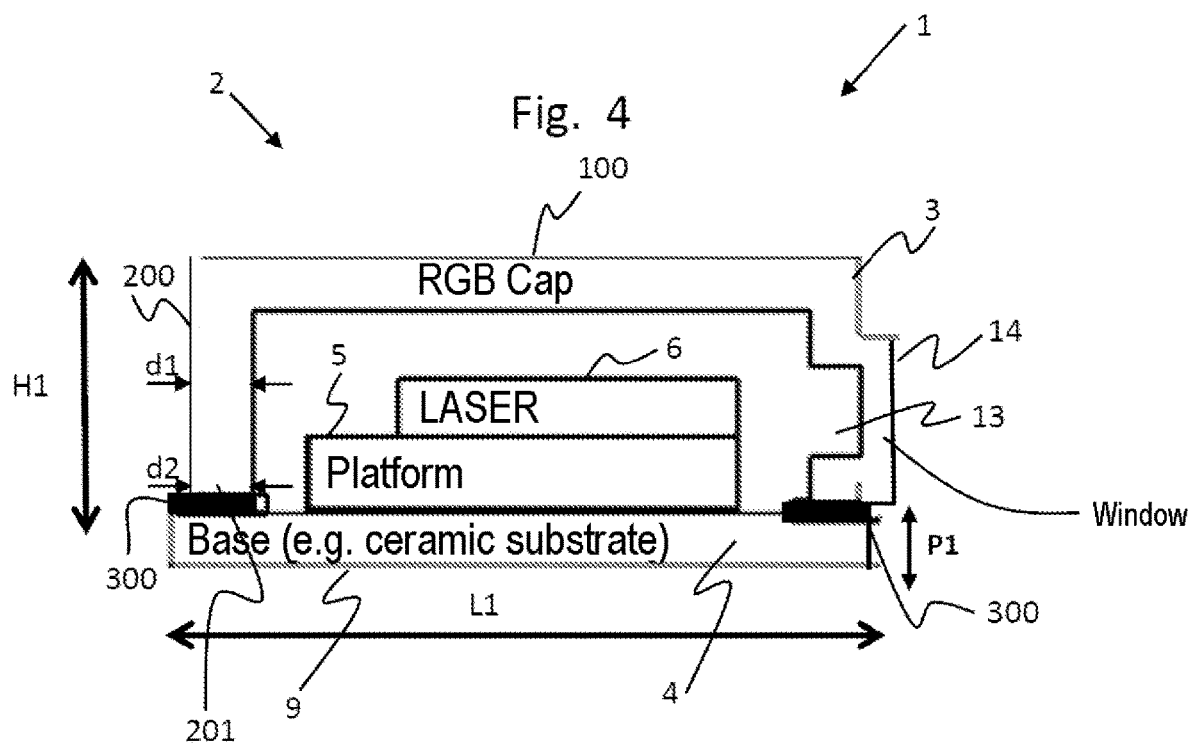
FIG. 4 shows a cross-sectional representation of a multilaser arrangement according to the present invention.

FIG. 4 shows a multilaser arrangement 1 in which the metal body of the housing cap 3 is produced or producible by a deep-drawing process. An additional process step in which any flange is trimmed may be provided, which can contribute to the desired shaping.

The housing cap 3 of the multilaser arrangement 1 advantageously has smaller dimensions than the embodiment shown for comparison in FIG. 3: H1<H2, L1<L2 and/or P1<P2; the advantage may have a particularly clear and advantageous effect in a smaller dimension L1<L2. Trimming a flange may, however, also contribute to smaller dimensions H1<H2 or P1<P2.

The housing cap 3 has an upper wall 100 and a side wall 200, which is formed integrally with the upper wall 100 and ends with a lower edge 201 fastened on the base plate 4. The lower edge 201 is fastened on the base plate 4 with a connecting material 300.

The side wall has a first thickness d1, measured in a direction perpendicular to its surface, and a second thickness d2 measured at the lower edge 201, particularly in the same direction, which is less than or equal (in this case equal) to the first thickness d1.

As already described, the housing cap 3 may generally have one or more rounded edges 101 or 204 (not shown in the cross-sectional representations).

Figure 5:
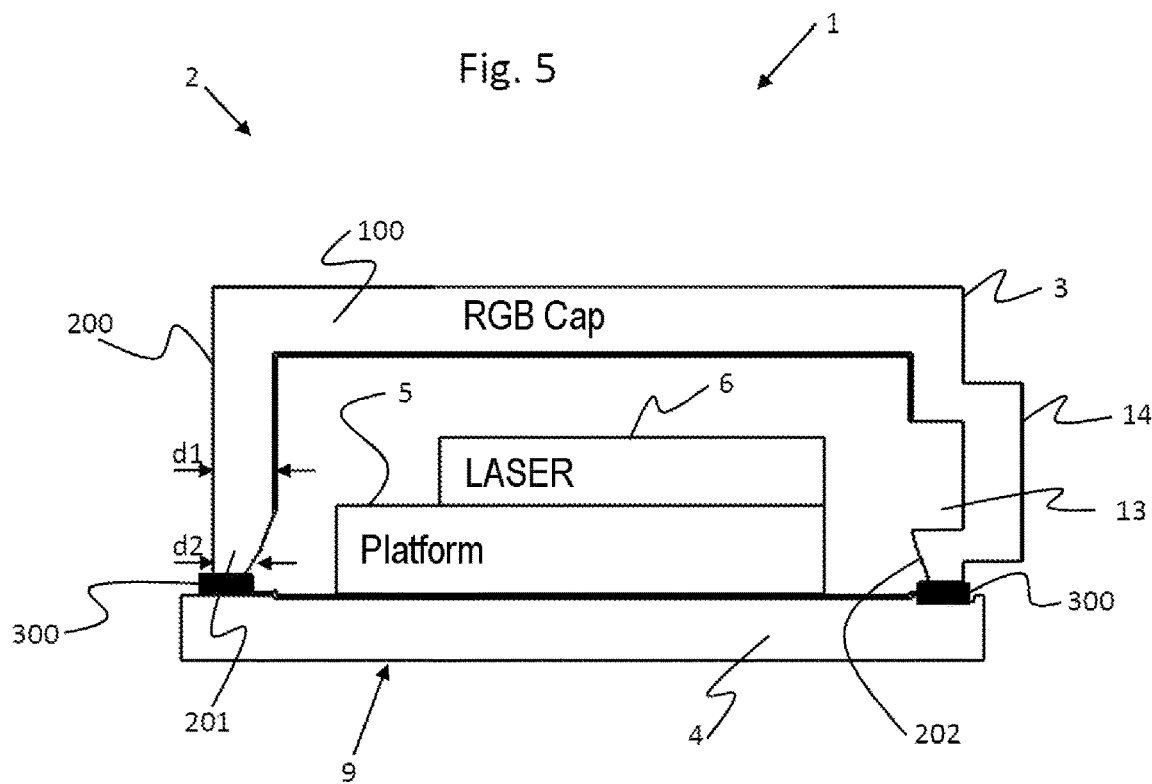
FIG. 5 shows a cross-sectional representation of a further multilaser arrangement according to the present invention.

FIG. 5 shows a multilaser arrangement 1 having a housing cap 3, the side wall 200 having an outwardly curved surface 202 at the lower edge 201 on the inner side of the housing cap 3, such that the second thickness d2 is less than the first thickness d1, and such that the thickness of the side wall decreases gradually toward the lowermost position of the side wall.

The connecting material 300 extends over a region which is shorter along the direction of the first thickness d1, or respectively the second thickness d2, of the side wall than the first thickness d1 or the second thickness d2.

Particularly because of the production process by way of a deep-drawing process, an outwardly drawn radius is created on the inner side of the foot of the cap. For subsequent use (soldering to the base plate 4), there is in particular the advantage that the wall thickness at the foot of the cap tapers, so that the connecting material can extend along a reduced width (the pad width or metallization width on the counter-piece, for example the base plate, is reduced). This contributes to miniaturization of the assembly or increases the installation space inside the housing 2.

Figure 6:
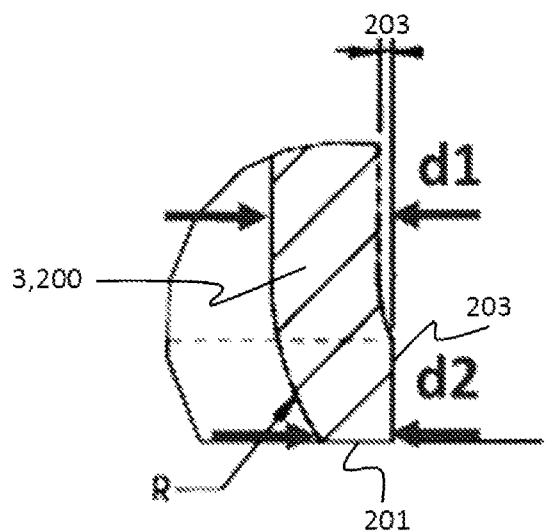
FIG. 6 shows a cross-sectional representation of the lower edge of a side wall.

FIG. 6 shows the lower edge 201 of a side wall 200 of a housing cap 3, the outwardly curved surface 202 being curved according to a radius R on the inner side of the housing cap 3. The housing cap 3 has in turn a second thickness d2 at the lower edge 201 which is less than the first thickness d1.

Furthermore, the side wall 200 has an overhang 203 at the lower edge 201 on the outer side, which is less than the first thickness d1, in particular less than one fifth of the first thickness d1. The overhang 203 is also less than the second thickness d2.

FIG. 7 shows a multilaser arrangement 1 having a housing cap 3, the lower edge 201 of the side wall 200 being fastened on the base plate 4 in such a way that a connecting material 301 is introduced between the outwardly curved surface 202 on the inner side of the housing cap and the base plate 4. The connecting material 300 and 301 is in this case a continuous connecting material, the connecting material 301 applied on the curved surface 202 protruding higher from the base plate than the connecting material 300 between the lower edge 201 of the side wall 200 and the base plate 4.

Particularly because of the production process by way of a deep-drawing process, an outwardly drawn radius may be created on the inner side of the foot of the cap, so that for subsequent use (soldering to the base plate), there is the advantage that the radius formed on the inner side of the walling on the one hand increases the effective soldering area of the housing cap (in particular the metal part), and on the other hand a larger meniscus angle of the connecting material (in particular solder) can be formed. Furthermore, with an equal width of the connecting material (pad width), more material volume (in particular solder volume) can be applied. These three points are conducive to more stable connection (in particular solder connection) and therefore a more durable product.

FIG. 8 shows the lower edge 201 of a side wall 200 of a housing cap 3, having an overhang 203 which is less than the first thickness d1, in particular less than one fifth of the first thickness d1, and a uniform connecting material 300, 301 applied on the lower edge 201, the part 301 of the connecting material which is attached to the curved surface 202 protruding higher.

Figure 9:
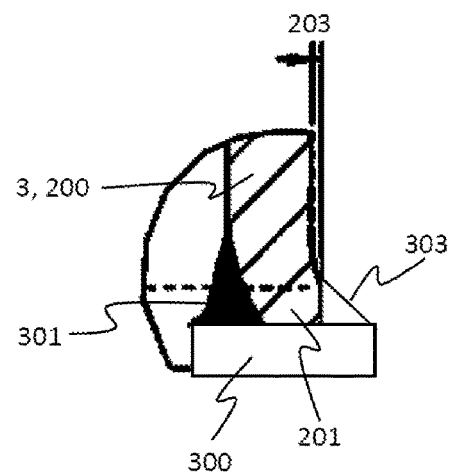
FIG. 9 shows a cross-sectional representation of the lower edge of a side wall with connecting material.

FIG. 9 shows another embodiment with a lower edge 201 of a side wall 200 of a housing cap 3, connecting material 303 which is applied on the outer side of the side wall 200, for example on an overhang, being provided between the base plate 4 (not shown in FIG. 9) and the side wall. The connecting material 300 can therefore form a solder meniscus on the outer side of the housing cap 3. The connecting material 303, which is adjacent to the outer side of the side wall 200, may protrude higher from the base plate than connecting material 300 that is optionally present in addition between the lower edge 201 of the side wall 200 and the base plate 4. Optionally, adjacent connecting material 301 may also be provided on the inner side of the side wall 200, as already described above. The connecting material 303 and optionally present connecting material 300 and/or 301 is optionally a continuous connecting material. In general, by the thickness d2 at the lower edge which is smaller than the thickness d1, and in particular by tapering and/or rounding, a narrower connecting material bead (in particular solder bead) may advantageously be achieved. In this way, in particular, an advantage may be achieved in respect of the dimensions compared with sharp-edged components and/or components having a flange (with and without a solder meniscus).

Figure 10:
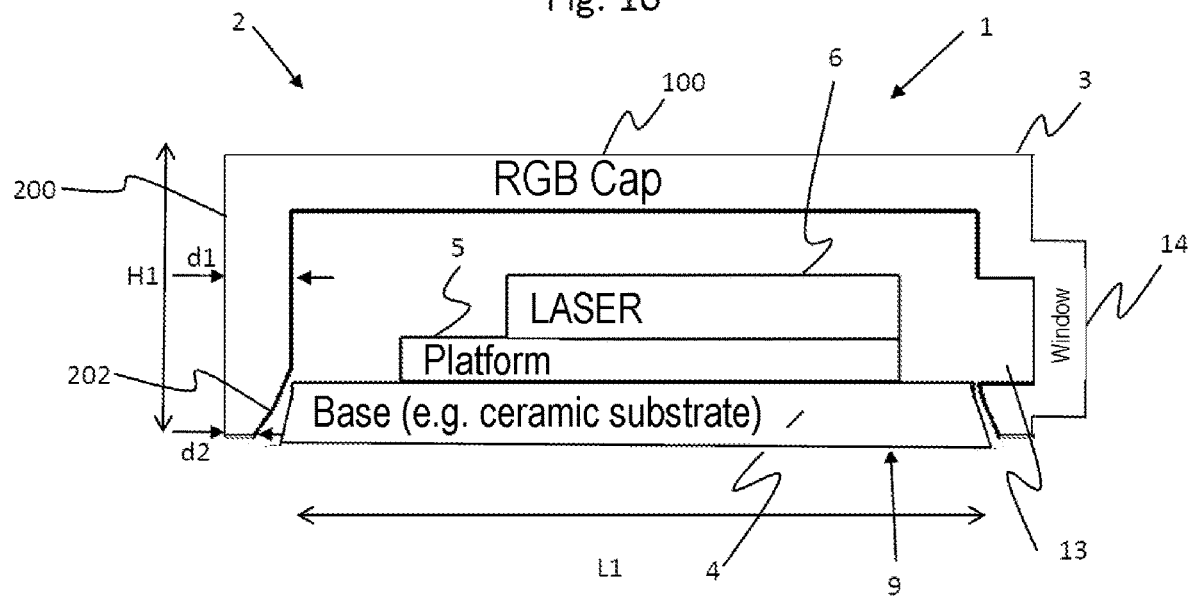
FIG. 10 shows a cross-sectional representation of a further multilaser arrangement according to the present invention.

FIG. 10 shows a multilaser arrangement 1 having a housing cap 3, which has an outwardly curved surface 202 at the lower edge 201 on the inner side of the housing cap 3, so that the second thickness d2 is less than the first thickness d1 and the thickness of the side wall decreases gradually toward the lowermost position of the side wall.

The outwardly curved surface 202 is used in this case as a guide aid when joining the housing cap 3 to the base plate 4. The base plate 4 may accordingly be introduced at least partially in the housing cap 3, so that the height of the assembly can be minimized even further. The base plate 4 may for this purpose have laterally curved end sides, which may be connected with connecting material to the curved surface 202 of the side wall 200 of the housing cap 3 (this is not shown in FIG. 9).

Particularly because of the production process by way of a deep-drawing process, the radius drawn outward on the inner side of the foot of the cap may be formed. For subsequent use, this provides the advantage in particular that the radius formed on the inner side of the walling can be used as an improved guide aid when joining the cap to the base plate. This may additionally provide a reduction in length and width of the overall package, in particular H1<H2 and L1<L2.

Figure 11:
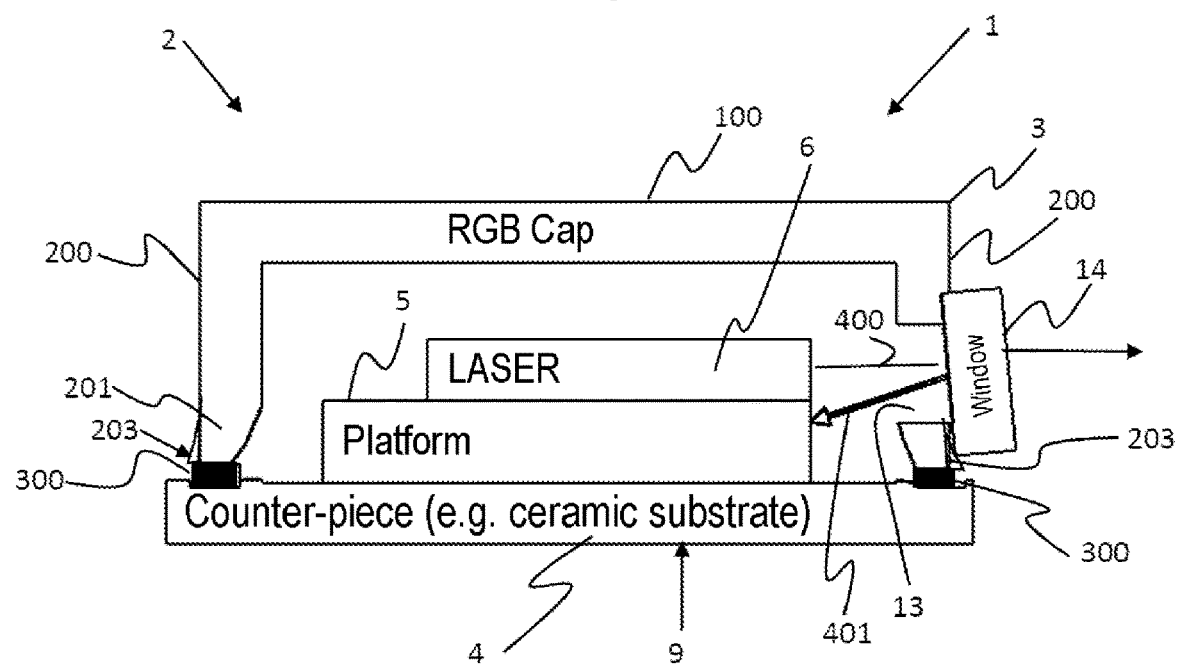
FIG. 11 shows a cross-sectional representation of a further multilaser arrangement according to the present invention.

FIG. 11 shows a multilaser arrangement 1 having a housing cap 3, which has an overhang 203 at the lower edge 201 on the outer side of the side wall 200. The transparent element 14 which is fastened on the outer side of the housing cap 3, in particular with connecting material 302, is fastened at the lower edge 201 on this overhang 203 so that the transparent element is oblique with respect to the surface of the side wall 200.

Particularly because of the production process by way of a deep-drawing process, besides the inner radius an overhang 203 may likewise be created on the outer side of the housing cap 3, or of the metal housing. This overhang has, in particular, the advantageous effect that the fastened (soldered) window is inclined a little because of it. In general, in the use of lasers (in particular EELs), parts of the emitted laser radiation 400 should be prevented from being reflected back into the laser cavity. Because of the obliquity of the transparent element 14, the fraction of reflected rays 401 is deflected to noncritical positions inside the housing 2.

Figure 12:
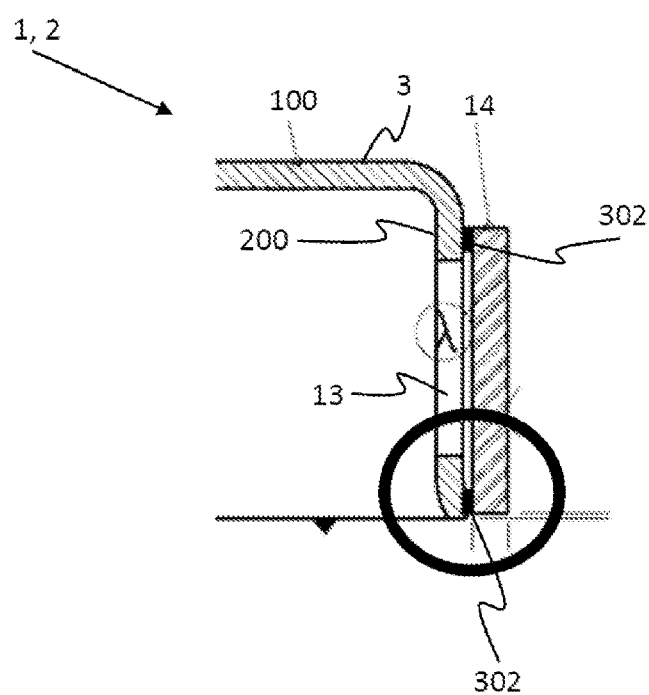
FIG. 12 shows a cross-sectional representation of a side wall including the opening with a transparent element.

FIG. 12 shows a multilaser arrangement 1, the transparent element being fastened around the opening 13 with connecting material 302 (in particular solder, for example glass solder and/or metal solder) on the side wall 200 of the housing cap 3.

Figure 13:
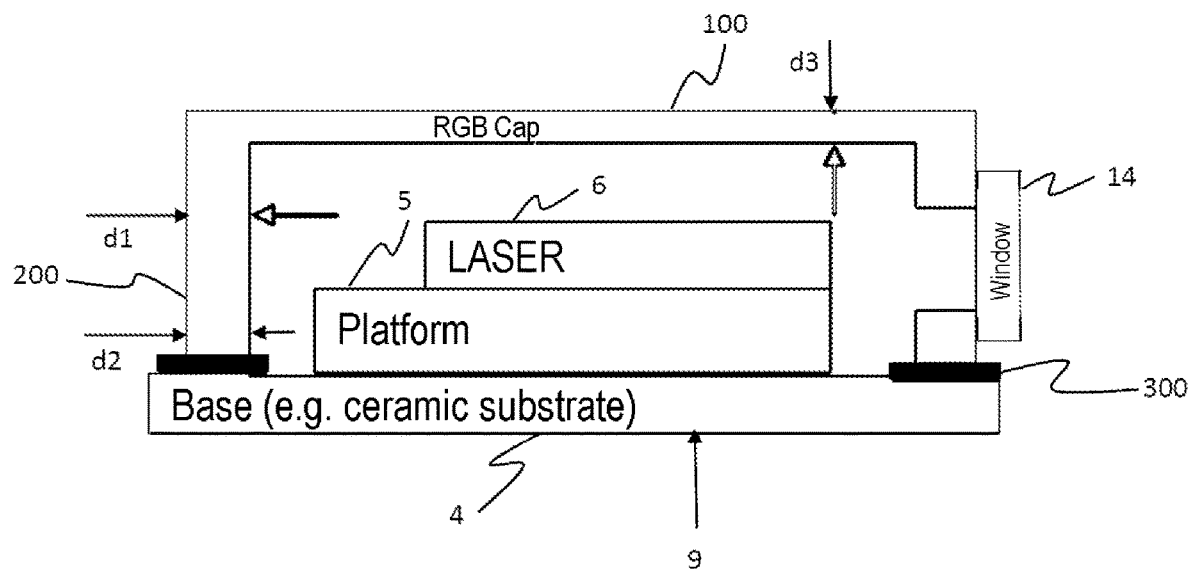
FIG. 13 shows a cross-sectional representation of a further multilaser arrangement according to the present invention.

FIG. 13 shows a multilaser arrangement 1, the upper wall 100 of the housing cap 3 having a thickness d3 which is less than the first thickness d1 of the side wall. One advantage of this is a weight reduction and/or a lightweight design.

The different wall thicknesses may, for example, be made possible by pre-embossing the starting material (for example of a metal strip) before the deep-drawing process.

Figure 14:
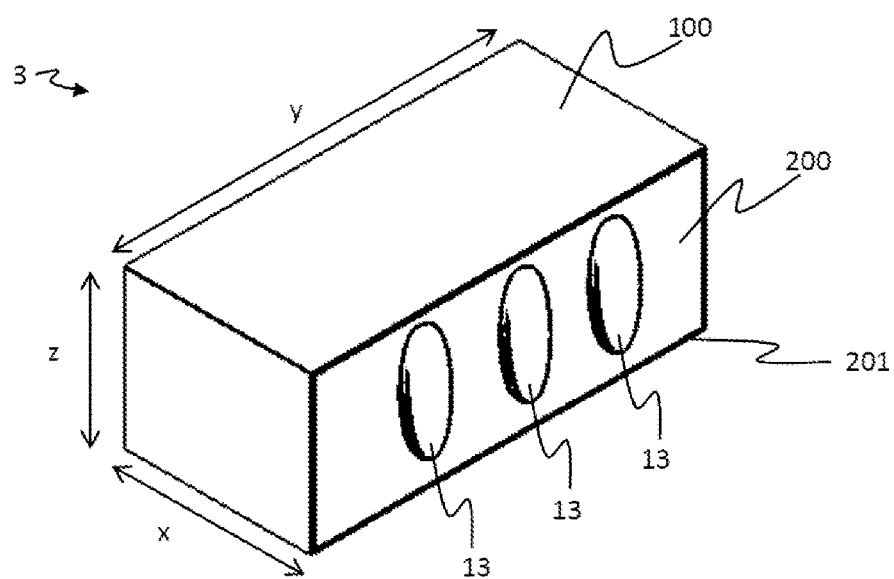
FIG. 14 shows a perspective representation of a further housing cap according to the present invention for a multilaser arrangement.

FIG. 14 shows a housing cap 3 having openings 13, which have a larger extent along a direction from the upper wall 100 to the lower edge 201 of the side wall 200 (z direction) than along a direction extending perpendicularly thereto in the side wall (y direction). In the specific example, the openings 13 are elliptically shaped. This has, in particular, the advantage of adaptation to an elliptical laser beam profile and therefore allows a smaller dimension in the y direction. In particular, the beam profile of an EEL laser typically has an elliptical nature. A further advantage is an increased mechanical stability of the housing cap 3.

Particularly if a starting material with introduced openings (for example a prestamped strip) is used in the production process of the cap, elliptical openings may be formed by the subsequent deep-drawing process. Another advantage in this case is less tool wear, or a longer tool service life (tool lifetime, less waste during the stamping), since less material needs to be removed in comparison with concentric openings. Furthermore, for process reasons, caps with a smaller height may be produced using prestamped strips.

It is clear to the person skilled in the art that the features and/or advantages described above may respectively be implemented individually or in combination.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A multilaser arrangement, comprising:
a housing including a base plate, a housing cap fastened on the base plate, and a transparent element, the base plate including a bottom face, the housing cap including at least one opening with the transparent element assigned to the at least one opening for the passage of an electromagnetic radiation;
a plurality of lasers, the lasers each being arranged inside the housing at a distance from the bottom face of the base plate, the housing cap including an upper wall and a side wall, which includes a lower edge and a surface, is formed integrally with the upper wall, and ends with the lower edge fastened on the base plate, the side wall having a first thickness and a second thickness, the first thickness being measured in a direction perpendicular to the surface of the side wall at a position where the side wall merges into the upper wall, the second thickness being measured at the lower edge and being less than the first thickness, wherein at least one of:
(a) the second thickness, measured at the lower edge, corresponds to a thickness of the side wall at a lowermost position of the side wall; and
(b) the first thickness of the side wall, measured in a direction perpendicular to the surface of the side wall, at least one of corresponds to a thickness of the side wall at a position which is adjacent to the upper wall, corresponds to a thickness of the side wall at a position which is located between the upper wall and the lower edge, and corresponds to an average thickness of the side wall.

2. The multilaser arrangement according to claim 1, wherein at least one of:
(a) the housing cap includes an inner side, the side wall including an outwardly curved surface at the lower edge on the inner side of the housing cap; and
(b) the side wall includes an outer side and is configured without an overhang at the lower edge on the outer side of the side wall, or the side wall includes an overhang.

3. The multilaser arrangement according to claim 1, wherein at least one of:
(a) the multilaser arrangement includes a connecting material, the lower edge of the side wall being fastened on the base plate in such a way that the connecting material is introduced between the lower edge of the side wall and the base plate;
(b) the multilaser arrangement includes a connecting material, the housing cap including an inner side, the side wall including an outwardly curved surface at the lower edge on the inner side of the housing cap, the lower edge of the side wall being fastened on the base plate in such a way that the connecting material is introduced between the outwardly curved surface on the inner side of the housing cap and the base plate; and
(c) the multilaser arrangement includes a connecting material, the side wall including an outer side, the lower edge of the side wall being fastened on the base plate in such a way that the connecting material is introduced between the outer side of the side wall and the base plate.

4. The multilaser arrangement according to claim 1, wherein at least one of:
(a) the side wall tapers at the lower edge; and
(b) the second thickness of the side wall, measured at the lower edge, is at least 5 percent less than the first thickness of the side wall.

5. The multilaser arrangement according to claim 1, wherein at least one of:
(a) the second thickness of the side wall, measured at the lower edge, is measured in a same direction as the first thickness of the side wall or in a direction which deviates therefrom by less than 45 degrees, less than 25 degrees, or less than 10 degrees; and
(b) the upper wall including a surface, the second thickness of the side wall, measured at the lower edge, being measured (1) in a direction which extends substantially parallel to at least one of (i) the surface of the upper wall and (ii) the bottom face of the base plate, or (2) in a direction which deviates therefrom by less than 45 degrees, less than 25 degrees, or less than 10 degrees.

6. The multilaser arrangement according to claim 1, wherein at least one of:
(a) the housing cap is configured in a shape of a hat, such that the side wall formed integrally with the upper wall is configured as a laterally circumferential walling; and
(b) the at least one opening of the housing cap is arranged in the side wall.

7. The multilaser arrangement according to claim 1, wherein at least one of:
(a) the at least one opening has a greater extent along a direction from the upper wall to the lower edge than along a direction extending perpendicularly thereto in the side wall; and (b) the at least one opening has an elliptical shape with a major axis along a direction from the upper wall to the lower edge.

8. The multilaser arrangement according to claim 1, wherein the housing cap comprises the transparent element assigned to the at least one opening, wherein the multilaser arrangement includes a connecting material, the transparent element being applied with the connecting material on the side wall comprising the at least one opening, in order to hermetically close the at least one opening.

9. The multilaser arrangement according to claim 1, wherein the housing cap includes an outer side, the transparent element being fastened on the outer side of the housing cap.

10. The multilaser arrangement according to claim 1, wherein at least one of:
(a) the upper wall of the housing cap includes a surface and a thickness, measured in a direction perpendicular to the surface of the upper wall, which is less than the first thickness of the side wall; and
(b) the upper wall of the housing cap includes a surface and a thickness, measured in a direction perpendicular to the surface of the upper wall, which is less than the second thickness of the side wall.

11. The multilaser arrangement according to claim 1, wherein at least one of:
(a) the upper wall and the side wall formed integrally with the upper wall comprise metal or consist of metal;
(b) the base plate (i) comprises ceramic or consists of ceramic, or (ii) comprises metal or consists of metal; and
(c) the transparent element at least one of (i) comprises glass or sapphire or consists of glass or sapphire, and (ii) has an optical treatment.

12. A housing cap for a multilaser arrangement, comprising:
an upper wall;
a side wall, which includes a lower edge and a surface, is formed integrally with the upper wall, and ends with the lower edge; and
at least one opening configured for passing an electromagnetic radiation therethrough, the side wall having a first thickness and a second thickness, the first thickness being measured in a direction perpendicular to the surface of the side wall at a position where the side wall merges into the upper wall, the second thickness being measured at the lower edge and being less than the first thickness, wherein at least one of:
(a) the second thickness, measured at the lower edge, corresponds to a thickness of the side wall at a lowermost position of the side wall; and
(b) the first thickness of the side wall, measured in a direction perpendicular to the surface of the side wall, at least one of corresponds to a thickness of the side wall at a position which is adjacent to the upper wall, corresponds to a thickness of the side wall at a position which is located between the upper wall and the lower edge, and corresponds to an average thickness of the side wall.

13. The housing cap according to claim 12, wherein at least one of:
(a) the housing cap further includes an inner side, the side wall including an outwardly curved surface at the lower edge on the inner side of the housing cap; and (b) the side wall includes an outer side and is configured without an overhang at the lower edge on the outer side of the side wall, or the side wall includes an overhang.

14. The housing cap according to claim 12, wherein at least one of:
    (a) the side wall tapers at the lower edge; and
    (b) the second thickness of the side wall, measured at the lower edge, is at least 5 percent less than the first thickness of the side wall.

15. The housing cap according to claim 12, wherein at least one of:
    (a) the second thickness of the side wall, measured at the lower edge, is measured in a same direction as the first thickness of the side wall or in a direction which deviates therefrom by less than 45 degrees, less than 25 degrees, or less than 10 degrees; and
    (b) the upper wall including a surface, the second thickness of the side wall, measured at the lower edge, being measured (1) in a direction which extends substantially parallel to the surface of the upper wall, or (2) in a direction which deviates therefrom by less than 45 degrees, less than 25 degrees, or less than 10 degrees.

16. The housing cap according to claim 12, wherein at least one of:
    (a) the housing cap is configured in a shape of a hat, such that the side wall formed integrally with the upper wall is configured as a laterally circumferential walling; and
    (b) the at least one opening of the housing cap is arranged in the side wall.

17. The housing cap according to claim 12, wherein at least one of:
    (a) the at least one opening has a greater extent along a direction from the upper wall to the lower edge than along a direction extending perpendicularly thereto in the side wall; and
    (b) the at least one opening has an elliptical shape with a major axis along a direction from the upper wall to the lower edge.

18. The housing cap according to claim 12,
    wherein the housing cap comprises a transparent element which is assigned to the at least one opening,
    wherein the multilaser arrangement includes a connecting material, the transparent element being applied with the connecting material on the side wall comprising the at least one opening, in order to hermetically close the at least one opening.

19. The housing cap according to claim 12,
    wherein the housing cap comprises a transparent element which is assigned to the at least one opening,
    wherein the housing cap includes an outer side, the transparent element being fastened on the outer side of the housing cap.

20. The housing cap according to claim 12, wherein at least one of:
    (a) the upper wall of the housing cap includes a surface and a thickness, measured in a direction perpendicular to the surface of the upper wall, which is less than the first thickness of the side wall; and
    (b) the upper wall of the housing cap includes a surface and a thickness, measured in a direction perpendicular to the surface of the upper wall, which is less than the second thickness of the side wall.

21. The housing cap according to claim 12, wherein at least one of:
    (a) the upper wall and the side wall formed integrally with the upper wall comprise metal or consist of metal;
    (c) the housing cap comprises a transparent element which is assigned to the at least one opening, and the transparent element at least one of (i) comprises glass or sapphire or consists of glass or sapphire, and (ii) has an optical treatment.

22. The housing cap according to claim 12, wherein the upper wall and the side wall formed integrally with the upper wall are produced or producible by way of a deep-drawing process.

23. A method for producing a housing cap, the method comprising the steps of:
    providing a flat starting material;
    deep-drawing the flat starting material in such a way that the housing cap having an upper wall and a side wall formed integrally with the upper wall is obtained;
    trimming the side wall at a lower edge of the side wall, in such a way that the side wall has a first thickness and a second thickness, the first thickness being measured in a direction perpendicular to a surface of the side wall at a position where the side wall merges into the upper wall, the second thickness being measured at the lower edge and being less than the first thickness, wherein at least one of:
    (a) the second thickness, measured at the lower edge, corresponds to a thickness of the side wall at a lowermost position of the side wall; and
    (b) the first thickness of the side wall, measured in a direction perpendicular to the surface of the side wall, at least one of corresponds to a thickness of the side wall at a position which is adjacent to the upper wall, corresponds to a thickness of the side wall at a position which is located between the upper wall and the lower edge, and corresponds to an average thickness of the side wall.

* * * * *